(12) United States Patent
Resta et al.

(10) Patent No.: US 7,414,902 B2
(45) Date of Patent: Aug. 19, 2008

(54) SEMICONDUCTOR MEMORY DEVICE WITH INFORMATION LOSS SELF-DETECT CAPABILITY

(75) Inventors: Claudio Resta, Villa di Tirano (IT); Ferdinando Bedeschi, Monza (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 11/415,879

(22) Filed: May 1, 2006

(65) Prior Publication Data
US 2007/0253238 A1 Nov. 1, 2007

(30) Foreign Application Priority Data
Apr. 29, 2006 (EP) ................................. 05103557

(51) Int. Cl.
*G11C 29/00* (2006.01)
(52) U.S. Cl. .................................. 365/200; 365/185.25
(58) Field of Classification Search .................. 365/200, 365/185.25, 185.11
See application file for complete search history.

(56) References Cited
U.S. PATENT DOCUMENTS

| | | | |
|---|---|---|---|
| 5,166,758 A | 11/1992 | Ovshinsky et al. | |
| 5,359,205 A | 10/1994 | Ovshinsky et al. | |
| 5,671,180 A | 9/1997 | Higuchi et al. | |
| 5,999,448 A | 12/1999 | Kurihara et al. | |
| 6,160,738 A * | 12/2000 | Atsumi et al. | 365/185.25 |
| 6,249,841 B1 | 6/2001 | Sikes et al. | |
| 6,876,033 B2 | 4/2005 | Cappelletti et al. | |
| 2003/0218925 A1 | 11/2003 | Torjussen et al. | |
| 2004/0165456 A1 | 8/2004 | Yamada | |
| 2005/0078519 A1 * | 4/2005 | Shiga | 365/185.17 |
| 2005/0135155 A1 * | 6/2005 | Ishimaru et al. | 365/185.25 |

FOREIGN PATENT DOCUMENTS
EP    1 426 971 A    6/2004

OTHER PUBLICATIONS
European Search Report for EP 05 10 3557 dated Oct. 13, 2005.

* cited by examiner

*Primary Examiner*—Vu A Le
(74) *Attorney, Agent, or Firm*—Lisa K. Jorgenson; Bryan A. Santarelli; Graybeal Jackson Haley LLP

(57) ABSTRACT

A semiconductor memory device, including a plurality of programmable memory cells each one adapted to be brought into one among at least a first status and a second status, said plurality of memory cells including memory cells intended to store data, and means for accessing the memory cells for reading/modifying their status. At least one memory cell in said plurality is used as detector memory cell, and control means operatively associated with the at least one detector memory cell are provided, said control means being adapted to establishing a potential loss of the data stored in the memory cells of said plurality based on a detected first status of the at least one detector memory cell.

36 Claims, 3 Drawing Sheets

SEMICONDUCTOR MEMORY DEVICE WITH INFORMATION LOSS SELF-DETECT CAPABILITY

PRIORITY CLAIM

This application claims priority from European patent application No. EP05103557.4, filed Apr. 29, 2005, which is incorporated herein by reference.

TECHNICAL FIELD

An embodiment of the present invention relates generally to the field of electronic circuits and memory systems, particularly to the field of Integrated Circuits (ICs) and, even more particularly, to ICs including solid-state memories.

An embodiment of the invention relates for example to non-volatile memories and, more in detail, to memories with memory cells based on phase-change materials, also known in the art as Ovonic Unified Memories (OUMs).

BACKGROUND

The OUM is a type of electrically-alterable non-volatile semiconductor memory device that has emerged in the last few years. This memory device exploits the properties of so called "phase-change" materials that can be reversibly switched between two phases, namely a generally amorphous, disordered phase and a generally crystalline, highly ordered phase.

A phase-change material exhibits different electrical characteristics, particularly a different resistivity, peculiar to each one of the two phases; in particular, when the phase-change material is in the amorphous phase, it exhibits a relatively high resistivity, whereas when the material is in the crystalline phase, it has a relatively low resistivity. Thus, each material phase can be conventionally associated with a corresponding one of the two logic binary values, "1" and "0". An example of a phase-change semiconductor memory is described in U.S. Pat. No. 5,166,758, which is incorporated by reference.

Typically, the memory device includes a matrix of phase-change memory cells, arranged in rows and columns with associated word lines and bit lines, respectively. Each memory cell consists of a storage element connected in series to an access element, for example the base-emitter junction of a Bipolar Junction Transistor (BJT), particularly a PNP BJT, associated with the storage element.

The storage elements are made of a phase-change material, typically a calcogenide (e.g., a $Ge_2Sb_2Te_5$ alloy); if the programmable storage element is in the amorphous phase, the memory cell is conventionally considered to be in a "reset" status, and this status is associated with a first logic binary value, typically the "0"; if the programmable storage element is in the crystalline phase, the memory cell is conventionally considered to be in a "set" status, which is associated with the opposite logic binary value, in the example the "1".

Without entering into particulars, which are per-se well known to those skilled-in the art, the phase of the phase-change material is stable below a predefined temperature (a typical temperature value is 150° C.). The material phase can be changed by heating the material over such a temperature; for this purpose, a voltage higher than a corresponding phase-change voltage value (for example, 0.6V) is applied to the memory cell's storage element; the applied voltage causes the flow of a current through a resistive element placed in contact with the phase-change material of the programmable storage element, which resistive element acts as a local Joule-effect heater, and accordingly raises the temperature of the phase-change material. Depending on the voltage applied thereacross, and thus on the current flowing therethrough, if the programmable storage element is heated over a so-called "nucleation temperature" (typically, 200° C.) and then cooled down slowly, the phase-change material becomes crystalline; conversely, if the programmable storage element is heated over a higher, so-called "melting temperature" (such as 600° C.) and then cooled down rapidly, the phase-change material becomes amorphous.

OUMs are thus intrinsically sensitive to high temperatures: if, after a memory cell has been brought to the reset status (shortly, it has been reset), it is exposed to a high temperature for a sufficient time, it may happen that the memory cell switches to the set status (i.e., the memory cell is set), with the consequence that the information previously stored therein is lost. Thus, any operation on the memory IC that involves the exposure thereof to relatively high temperatures (e.g., temperatures approaching 150° C.) is at least potentially dangerous, because it may cause a partial or even total loss of the stored data.

It has been observed that a problem arises when, for the correct operation of the memory device, a preliminary device initialization procedure is required, which typically means properly configuring selected storage elements, e.g. some memory cells of the memory device.

Typically, the device initialization procedure may consist in one or more steps that are performed at the first power up of the memory device. The first power up of the memory device usually takes place during the post-manufacturing test phase (so-called EWS, acronym for Electrical Wafer Sorting) in which the device initialization procedure is necessary for the correct operation of the memory device under testing.

For example, during the EWS, defects in the memory device are identified. Manufacturing processes of integrated circuits are inherently affected by defectiveness, especially in the early stages of a newly-developed manufacturing technology. Semiconductor memories, being characterized by a very large integration scale, are greatly affected by manufacturing defects. Within a semiconductor memory, defects in the memory cell matrix are highly probable; unfortunately, a defect that impairs the functionality of even a single memory cell may cause the whole memory device to be discarded, with a consequent significant reduction of the process yield, and an increase of costs. For this reason, redundant word lines or bit lines of memory cells (structurally identical to the normal memory cells that would be strictly necessary for achieving the desired storage capacity, and provided in the memory matrix in addition thereto) are normally provided in the memory device, for functionally replacing a defective word line or bit line.

Thus, in order to fully test the memory device, it may be necessary to functionally replace defective memory cells (or entire defective word lines, or bit lines) with redundancy ones, and this may involve storing information concerning, for example, the defective cells' addresses.

As another example, during the EWS, it may be necessary to set trimmerable circuit structures, like voltage/current generators, partitioners and the like, and this as well may involve storing in the memory IC a selected trimming configuration.

All this initialization data, and other, may have to be stored in OUM cells. A typical case in which initialization data are to be stored in OUM cells is the programming of OUM cells to be used as reference voltage/current generators for, e.g., reading the other memory cells during the normal memory device operation.

After the EWS phase, the wafer is separated into dies, and the dies are packaged; the packaged dies are then assembled on PCBs (acronym for Printed Circuit Boards). Both these operations involve very high temperatures, well above the temperature ensuring phase stability of the phase-change material; such high temperatures may cause the OUM memory cells to switch from the reset status to the set status, loosing the information previously stored.

In particular, initialization data that had been stored in OUM cells during the EWS may be lost. This may be critical, for example because at the successive power-up of the memory device (usually, taking place on field when the memory has already been incorporated in a user's electronic system), the memory device circuit structures will not be properly initialized, and thus they will not operate correctly and the user may even not be aware of this, expecting instead that everything goes right.

It has also been observed that similar problems are incurred in other types of semiconductor memory devices, whenever the memory cells are sensitive to temperatures, such as for example in ferroelectric memories.

SUMMARY

According to an embodiment of the present invention, the idea is suggested of using one or more of the memory cells of a semiconductor memory device, e.g. one or more OUM cells, as indicator(s) of a potential loss of data, e.g. of an occurred switching from a reset status to a set status of the OUM cells, particularly but not limitatively of those cells used for storing memory device's initialization data. In this way, by checking the indicator cell(s), it is possible to ascertain if, for example, the initialization data have been lost.

More particularly, according to an embodiment of the present invention, a semiconductor memory device is provided, including a plurality of programmable memory cells each one adapted to be brought into one among at least a first status and a second status. Moreover, said plurality of memory cells includes memory cells intended to store data. The semiconductor memory device further includes means for accessing the memory cells for reading/modifying their status. The semiconductor memory device comprises at least one detector memory cell in said plurality, and control means operatively associated with the at least one detector memory cell. Moreover said control means are adapted to establishing a potential loss of the data stored in the memory cells of said plurality based on a detected first status of the at least one detector memory cell.

The proposed embodiment may solve some or all of the above-discussed problems associated with the device-initialization procedure.

Indeed, this embodiment renders it possible to ascertain whether the memory device has been exposed to critical temperatures that may have caused a loss of the information stored in the memory cells, particularly in those cells used for storing initialization data.

In particular, thanks to the proposed embodiment, it is possible to ascertain if, after the die packaging and the assembling on PCB, it is necessary to perform again the device initialization procedure.

This helps to avoid possible malfunctioning of the memory device in the field.

BRIEF DESCRIPTION OF THE DRAWINGS

Features and advantages of the present invention will be made apparent by the following detailed description of some embodiments thereof, provided merely by way of non-limitative examples, a description that will be conducted making reference to the following drawings.

DETAILED DESCRIPTION

Figure 1:
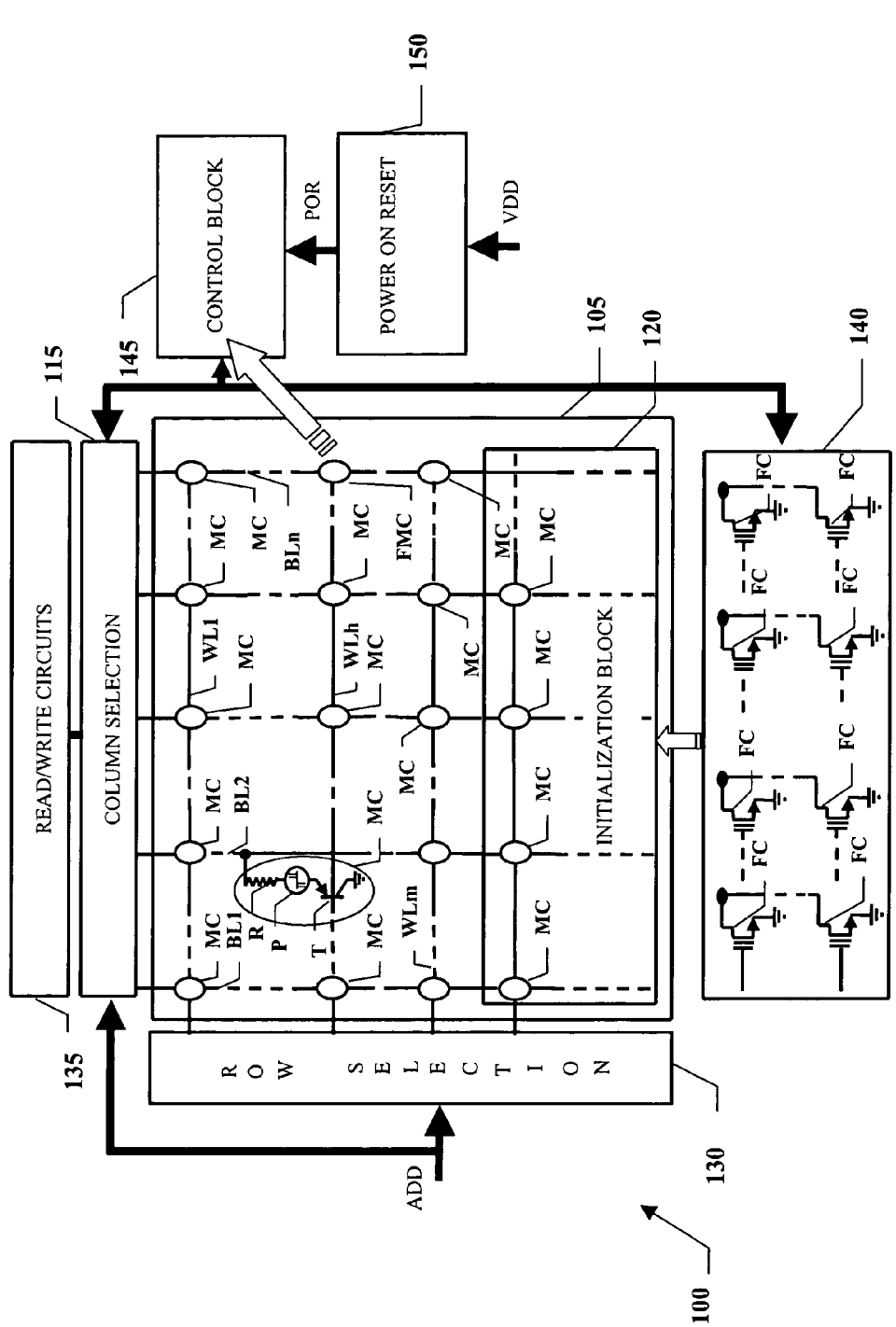
FIG. 1 schematically shows a memory device according to an embodiment of the present invention, particularly a OUM device, limitedly to functional blocks thereof relevant to the understanding of the embodiment to be described.

With reference to the drawings, in FIG. 1 the main functional blocks of a semiconductor memory device 100 are shown according to an embodiment of the invention.

The memory 100 includes a two-dimensional arrangement or matrix 105 of a plurality of memory cells MC; the matrix 105 includes in particular memory cells MC intended to store users' data. The memory cells MC in the matrix 105 are arranged by, e.g., m rows and n columns; a respective word line WL1-WLm is associated with each matrix row, and a respective bit line BL1-BLn is associated with each matrix column.

In particular, in the exemplary invention embodiment herein considered, the memory cells MC are phase-change OUM memory cells.

Each memory cell MC in the matrix 105 includes a programmable storage element P having a programmable resistivity; the programmable storage element P is connected in series to a resistor R.

The programmable storage element P is also connected in series to an associated access element, in the shown example consisting of the emitter-base junction of a PNP Bipolar Junction Transistor (BJT) T (other implementations of the access element are possible).

Each memory cell MC in the matrix 105 is connected to a respective one of the word lines WL1-WLm and a respective one of the bit lines BL1-BLn. In particular, within each memory cell MC the programmable storage element P has a first terminal connected to the corresponding bit line BL1-BLn through the resistor R and a second terminal connected to the emitter terminal of the associated access element, for example the emitter-base junction of the BJT T; the BJT T has the base terminal connected to the corresponding word line WL1-WLm and the collector terminal connected to a reference voltage line, typically the ground.

Each programmable storage element P is made of a phase-change material; typically, the phase-change material consists of a calcogenide (e.g., a $Ge_2Sb_2Te_5$ alloy). The phase-change material can be reversibly switched between a generally amorphous, disordered phase and a generally crystalline, highly ordered phase.

When the programmable storage element P is in the amorphous phase, characterized by a high resistivity, the memory cell MC is conventionally considered to be in the reset status, associated with the first logic binary value, for example the "0"; if the programmable storage element P is in the crystalline phase, characterized by a low resistivity, the memory cell MC is conventionally considered to be in the set status, which is associated with the opposite logic binary value, in the example herein considered the "1".

Without entering into particulars, which are per-se well known in the art, the phase of the phase-change material is stable below a predefined temperature (such as 150° C.). The material phase can be changed by heating the material over such a temperature; for this purpose, a voltage Vp higher than a corresponding phase-change value Vpc (for example, 0.6V) is applied to the programmable storage element P; the applied voltage causes the flow of a current Ip through the resistor R, which acts as a local Joule-effect heater, and accordingly raises the temperature of the phase-change material. Depending on the voltage applied thereacross, and thus on the current flowing therethrough, if the programmable storage element P is heated over a nucleation temperature (typically 200° C.) and then cooled slowly, the phase-change material becomes crystalline; conversely, if the programmable storage element P is heated over a higher, melting temperature (such as 600° C.) and then cooled rapidly, the phase-change material becomes amorphous.

The state of the programmable storage element P can be detected by applying thereacross a read voltage (suitably lower than the phase-change value Vpc, not to cause an undesired change of phase of the material). The resulting current that flows through the programmable storage element P has a value that depends on the resistivity of the phase-change material, and provides therefore an indication of the material phase.

A generic memory cell MC within the matrix 105 is accessed by selecting the corresponding row and column pair, i.e. by selecting the corresponding word line and bit line pair. To this purpose, a row selection block 130 and a column selection block 115 are provided; these circuits perform the selection of the word lines and of the bit lines on the basis of an address binary code ADD. In greater detail, the memory device 100 receives the address ADD, for example from an external device like a microcontroller, microprocessor, digital signal processor for accessing a corresponding memory cell (more typically, a corresponding group of, e.g., 8 or 16 memory cells depending on the degree of parallelism of the memory device), a portion of which is supplied to the row selection block 130, which selects the desired word line, and the other portion is supplied to the column selection block 115, which selects the desired bit line (or a packet of, e.g., 8 or 16 bit lines).

The column selection block 115 interfaces with a read/write circuits block 135. The read/write circuits block 135 includes all the components (e.g., sense amplifiers, comparators, reference current/voltage generators, pulse generators, program load circuits and the like) which are normally required for writing the desired logic values into the selected memory cells MC, and for reading the logic values currently stored therein.

The read/write circuits block 135 is coupled to externally-accessible terminals of the memory (not shown in figure) for delivering/receiving data.

In a stand-by operating condition, as well as before any read or write operation on the memory device 100, the row selection block 130 keeps all the word lines WL1-WLm at a relatively high voltage Vh, also referred to as the word line deselection voltage (a typical value of this voltage may for example be 4.5V; a similar voltage is used for keeping the word lines deselected during a memory write operation); the word line deselection voltage Vh is such that the emitter-base junction of the BJT T in every memory cell MC is kept reverse biased; in this way, none of the memory cells MC is accessed, because all the access elements are disabled. At the same time, the column selection block 115 keeps all the bit lines BL1-BLn disconnected, and thus isolated, from the read/write circuits block 135.

During a read or a write operation, the row selection block 130 lowers the voltage of a selected one of the word lines WL1-WLm to a word line selection voltage Vl (having for example value equal to 0V—the ground), while the remaining word lines are kept at the word line deselection voltage Vh; similarly, the column selection block 115 couples a selected one of the bit lines BL1-BLn (more typically, a selected bit line packet of, e.g., eight or sixteen bit lines) to the read circuits or to the write circuits in the read/write circuits block 135, depending on the operation to be performed; the selected bit lines are brought to a voltage corresponding to the operation to be performed, while the remaining, non-selected bit lines are left floating. In this condition, the access elements associated with the memory cells MC belonging to the selected word line and the selected bit lines are forward biased, and enable the access to the corresponding storage elements P.

In the read/write circuits block 135, the current flowing through each corresponding programmable element P is compared to a reference value (typically provided by one or more reference memory cells in the matrix 105); when the programmable element P is in the crystalline phase, a current higher than the reference value is detected, and this situation is conventionally decreed to correspond to the logic value "1", whereas when the programmable element P is in the amorphous phase, a current lower than the reference value is detected, and this situation is conventionally decreed to correspond to the logic value "0".

As previously mentioned, for the correct operation of the memory device a device initialization procedure may have to be to performed, for storing initialization data, in particular in phase-change memory cells, for example phase-change memory cells of the matrix 105.

The device initialization procedure may include one or more steps that are performed at the first power up of the memory device.

In FIG. 1, an initialization block 120 of the matrix 105 is shown. In the exemplary embodiment herein considered, the initialization block 120 is considered to be a portion of the matrix 105 and includes initialization memory cells MC used for storing (at least part of) the memory device's initialization data. In greater detail, the initialization block 120 may include initialization memory cells used for storing initialization data necessary for the operation of redundancy circuits included in the memory device, memory cells intended to be used as reference cells for providing reference voltages/currents to be used for example for reading the other memory cells, and memory cells used for storing configuration data of trimmerable circuit structures (e.g., voltage/current generators, voltage/current partitioners, and the like) provided in the memory.

As discussed in the foregoing, the OUM cells are intrinsically sensitive to high temperatures, thus the OUM cells in the initialization block 120 may loose the initialization data, if the memory is submitted to high temperatures, as may occur during the device packaging and assembling into a PCB of an electronic system.

According to an embodiment of the present invention, at least one detector phase-change memory cell FMC is provided in the matrix 105. The detector phase-change memory cell FMC is used for detecting a possible switching of OUM cells, from the reset status to the set status, and thus a potential loss of information stored therein, due, for example, to the exposure to high temperature.

In particular, the detector phase-change memory cell FMC may be used for detecting a switching of OUM cells of the initialization block 120, that is, for detecting a potential loss of the initialization data of the memory device.

In an embodiment of the present invention, the detector phase-change memory cell FMC is structurally identical to the memory cells MC of the matrix 105, and is adapted to behave as a check flag bit used as indication of the fact that data stored in the cells of the initialization block 120 of the matrix may have been lost after the first power up.

In particular, initially, for example after the first initialization of the memory device 100 performed during the EWS, and thus before the memory device chip packaging, the detector phase-change memory cell FMC is programmed in the reset status, associated with the "0" logic state of the check flag bit; in this way, the set status of the detector phase-change memory cell FMC, corresponding to the "1" logic state of the check flag bit, is used as an indication that the information stored in the OUM cells of the matrix, and in particular of the OUM cells of the initialization block 120, may have been lost.

A control block 145 is further provided in the memory device 100. The control block 145, for example a programmable logic or a finite-state machine, is adapted to verify the status of the detector phase-change memory cell FMC, and thus the logic state of the check flag bit and, based on the detected check flag bit state, to determine whether the OUM cells have potentially lost data stored therein, particularly the initialization memory cells of the initialization block 120 intended to store the initialization data.

In particular, the control block 145 performs the above task at the power up of the memory device 100, particularly at each power up. To this purpose, the control block 145 receives an enabling signal POR from a power-on-reset circuit block 150. The power-on-reset circuit block 150 is a circuit adapted to sense the presence of a supply voltage VDD, and it asserts the enabling signal POR when it detects that the supply voltage VDD has reached a predetermined level.

The assertion of the enabling signal POR causes the control block 145 to start a procedure for sensing the detector phase-change memory cell FMC (for example, by selecting that cell through the row selection and column selection circuits 130 and 115, and sensing it through the read circuits in the read/write circuits block 135), so as to determine the current logic state of the check flag bit.

According to an embodiment of the present invention, a non-volatile temperature-resistant storage block 140 is further provided, with which the control block 145 interfaces.

The non-volatile storage block 140 includes non-volatile storage elements adapted to non-volatily store data even in absence of power supply, and that are not sensitive to high temperatures, or at least are less sensitive to high temperatures than the OUM cells, so that the storage elements in the non-volatile storage block 140 do not loose the information stored therein during packaging or during assembling of the package device into PCB when the memory is exposed to high temperatures. For example, the non-volatile storage block 140 may include flash memory cells (memory cells formed by transistors having a floating gate), as schematically depicted in FIG. 1, or alternative storage elements such as fuses.

As another example, electrically erasable and programmable non-volatile memory cells as described in U.S. Pat. No. 6,876,033 can exploited, which are simple to be integrated in a OUM device chip (not necessitating complex dedicated steps). U.S. Pat. No. 6,876,033 is incorporated by reference.

During the EWS, the initialization data for the memory device, in addition to being stored in the OUM cells of the initialization block 120, are (at least partly) stored into the non-volatile storage block 140, in such a way to ensure that such data are retained even when the memory device is exposed to high temperatures and the OUM cells of the initialization block 120 possibly switch to the set status, loosing the stored data. The data for initializing the memory device are typically received from outside the memory, e.g. from EWS equipment.

When, at the memory device power up, the power-on reset block 150 asserts the enabling signal POR and, by accessing the detector phase-change memory cell FMC, the control block 145 ascertains that the check flag bit is a '1', the control block 145 starts the device initialization procedure. The device initialization procedure uses the initialization data stored in the non-volatile storage block 140 for re-initializing the memory device. During the device initialization procedure, under the control of the control block 145, the initialization data stored in the non-volatile storage block 140 are copied into the proper OUM cells of the initialization block 120. At the end of the device initialization procedure, the control block 145 causes the detector phase-change memory cell FMC to be switched to the reset status, and thus the check flag bit is reset to a logic "0" (the control block 145 commands the programming of the detector phase-change memory cell FMC to the reset status, using the circuits in the read/write block 135). If instead, at the device power up, the control block 145 ascertains that the check flag bit is a logic '0' (meaning that the detector phase-change memory cell FMC has not switched to the set status), the control block 145 does not start the device initialization procedure.

Figure 2:
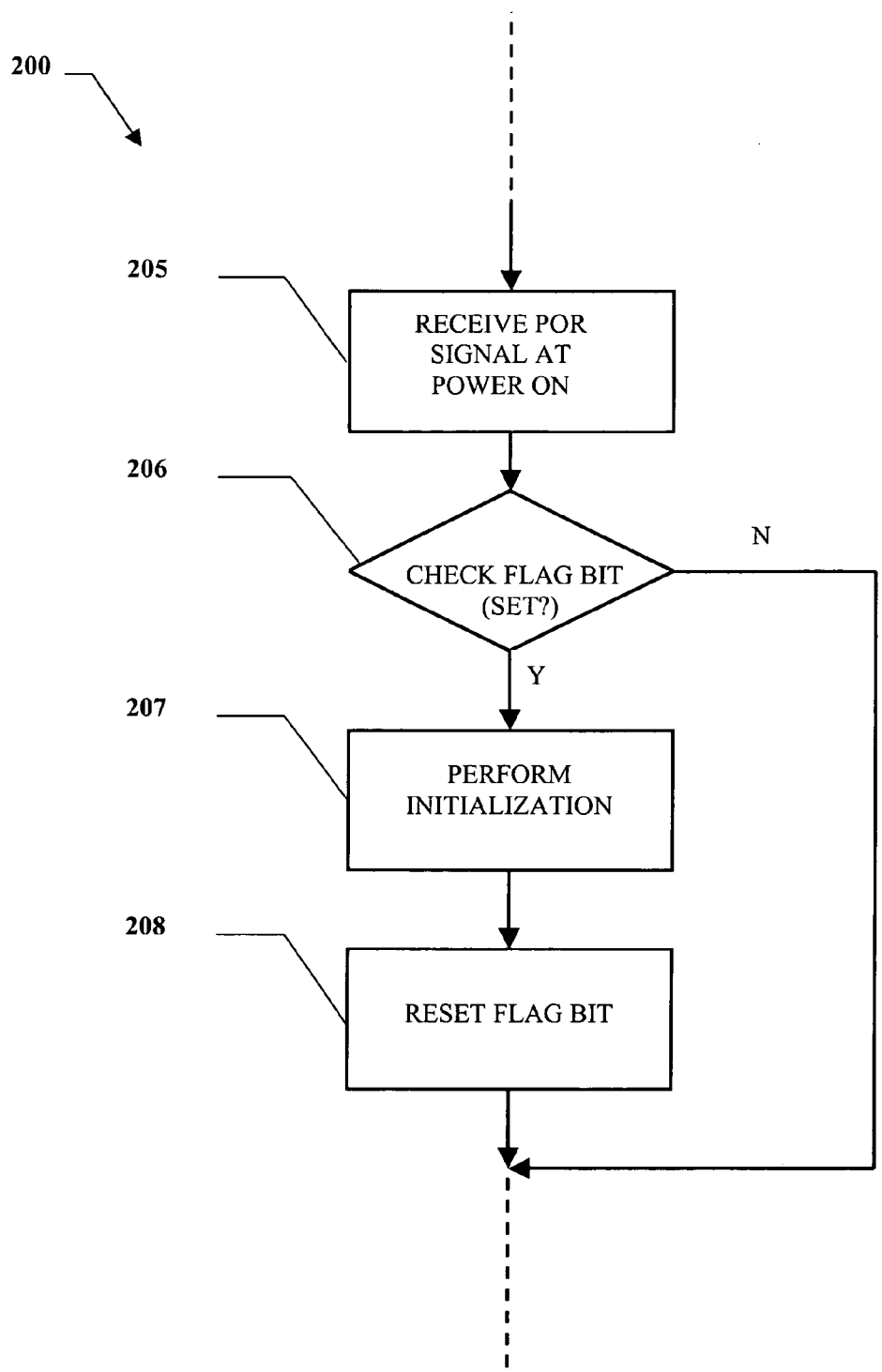
FIG. 2 shows a simplified flow chart of a procedure according to an embodiment of the present invention for detecting that the memory device needs to be re-initialized.

A flow chart 200 of the operations performed by the memory device, particularly by the control block 145, for verifying the state of the check flag bit, is shown in FIG. 2 according to an embodiment of the invention. Let it be assumed that a memory device power on takes place: the control block 145 detects the assertion of the POR signal (block 205). Successively, the control block 145 verifies if the check flag bit is a logic "1", i.e. whether the detector phase-change memory cell FMC is in the set status (block 206). As discussed in the foregoing, the detector phase-change memory cell FMC may have been set as a consequence of an exposure of the device to high temperatures, or due to the fact that the memory device has never been initialized. In the negative case, the memory device is assumed to be properly initialized, and no device initialization procedure is needed. In the affirmative case, the control block 145 causes the device initialization procedure to be performed (block 207), and the data stored in the non-volatile storage block 140 are copied into the OUM cells of the initialization block 120. At the end of the initialization procedure, the control block 145 causes the detector phase-change memory cell FMC to be reset, and thus the check flag bit is brought to a logic "0" (block 208). From now on, the memory continues with conventional subsequent operations (not shown in FIG. 2).

Alternatively, in a further embodiment of the invention, the control block 145 may be adapted to simply sensing the status of the detector phase-change memory cell FMC so as to establish the logic state of check flag bit. When the control block 145 ascertains that the check flag bit is a logic "1", the control block 145 transfers this information to a memory controller which is external to the memory device, for example a microprocessor. Thus, when the control block 145, ascertains that the device initialization procedure needs to be performed, the external microprocessor, exploiting the indication provided by the control block 145 starts the initialization procedure of the memory device. Under the control of the external microprocessor, the initialization data, stored in the non-volatile storage block 140, are copied in to the initialization block 120, so that the memory device is properly initialized. As a further alternative, the non-volatile storage block 140 might not be provided, and the initialization data for the memory device be received from the outside, e.g. from the external microprocessor.

Figure 3:
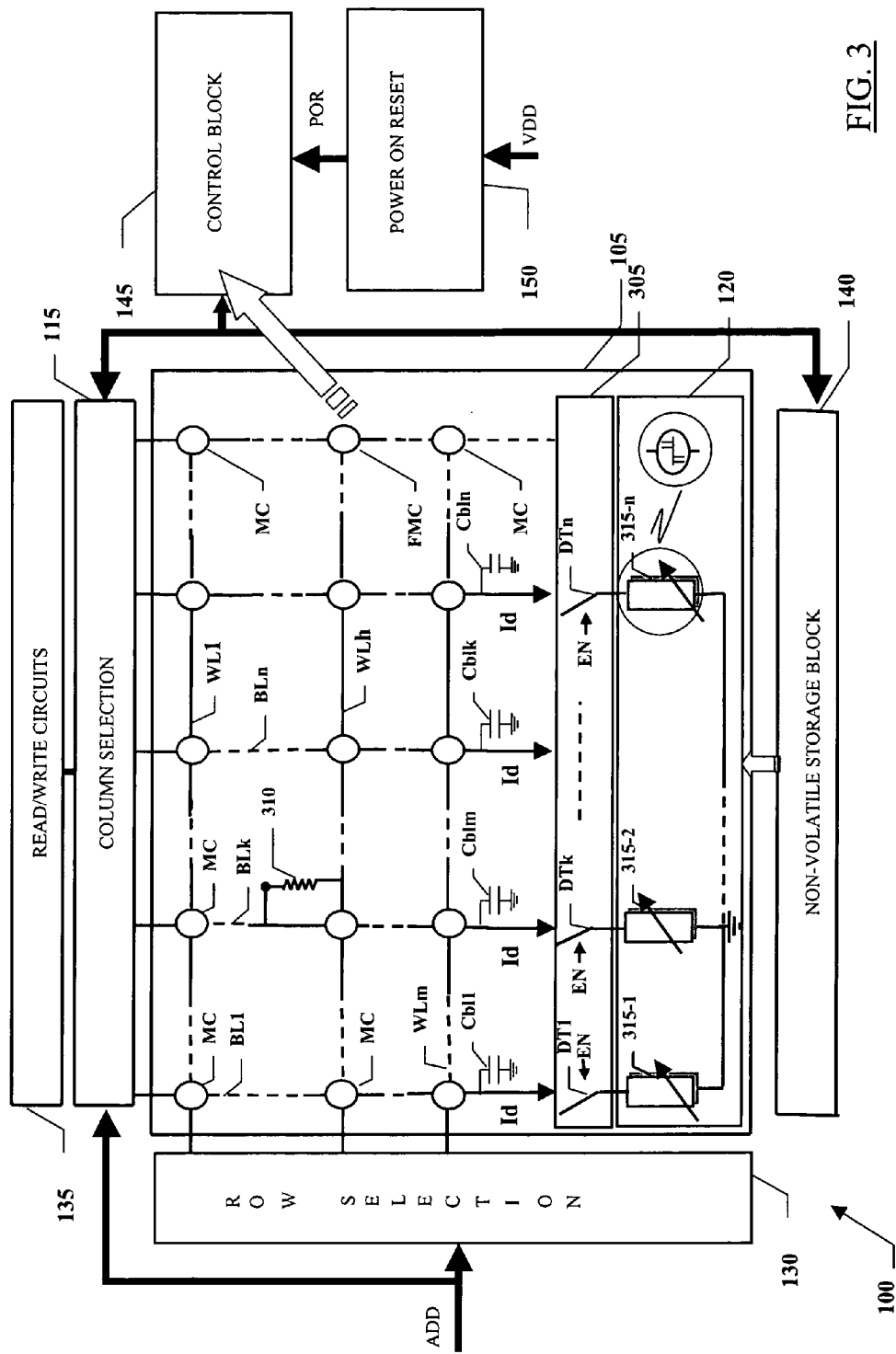
FIG. 3 schematically shows an exemplary practical use of OUM cells for storing initialization data of the memory device according to an embodiment of the invention.

Referring now to FIG. 3, a portion of the initialization block 120 included in the memory device 100 is shown in greater detail, according to an embodiment of the invention.

In particular, OUM cells of the block 120, which are used for controlling a discharge of the matrix bit lines, are shown.

As discussed above, the device initialization procedure provides for transferring the initialization data stored in the non-volatile storage block 140 into the initialization block 120. This operation occurs as a consequence of the fact that the control block 145 ascertains that the device initialization procedure needs to be performed.

As previously mentioned, a malfunctioning of the memory device may be induced by leakage currents that flow through the base-emitter junctions of the access element BJTs T even when the base-emitter junctions thereof are reverse-biased; during the memory device stand-by or, generally, before a read or write operation, these leakage currents, cause the charging of stray capacitances $C_{BL1}$-$C_{BLn}$, intrinsically associated with the bit lines BL1-BLn of the memory device 100; consequently, the voltage of the bit lines raises towards the word line deselection voltage Vh and may cause a spurious access to undesired memory cells.

In order to avoid the problems of spurious access to undesired memory cells, caused by the rise of the bit line voltage, it is therefore necessary to discharge the bit line stray capacitances before starting a read or a write operation. During the discharge of the bit line stray capacitances $C_{BL1}$-$C_{BLn}$, a problem may arise in case a low resistant path or even a short-circuit 310 between one BLk of the matrix bit line BL1-BLn and one WLh of the matrix word lines WL1-WLm exists, due to a manufacturing defect. In fact albeit this type of defect can be repaired by functionally replacing the defective bit line BLk and the defective word line WLh short-circuited thereto with a redundant pair of bit line and word line (not shown in the drawing), the discharge of the bit line stray capacitances would result in a high discharge current flowing from the word line deselection voltage distribution line Vh to the reference voltage distribution line. This may easily cause the memory to exhibit an unacceptably high power consumption and, when the word-line deselection voltage is generated on-chip by means of charge-pump voltage generators, the excessive current absorption may easily cause the charge-pump output voltage to fall below a safety level, with the consequence that the operation of the entire memory might be compromised.

In order to avoid the problem of high power consumption, a control of the bit-line discharge current of the stray capacitances $C_{BL1}$-$C_{BLn}$ is implemented.

To this purpose, a bit line discharge circuit block 305 is provided, schematically depicted as consisting of switches DT1-DTn, for example realized by means of MOS-type transistors, associated with each bit line BL1-BLn. The bit line discharge circuit block 305 is enabled, through an enabling signal EN, in a bit line discharge phase of the memory device operation, preceding any operation that involves the selection of a word line WL1-WLm, for discharging the bit line stray capacitances $C_{BL1}$-$C_{BLn}$.

The initialization block 120 includes initialization memory cells adapted to act as variable resistance elements 315-1-315-n used for controlling a discharge current when the bit line discharge circuit block 305 is activated.

The variable resistance elements 315-1-315-n have a resistance variable in a controlled way between at least a first and a second values, the first resistance value being relatively low, whereas the second resistance value is substantially higher.

Thus, in case the generic variable resistance element 315-1-315-n is in the low resistance state and the enabling signal EN is asserted, the voltage drop thereacross is substantially zero, the respective transistor that realize the switch DT1-DTn will experience a full gate-source drive voltage, and the flow of a relatively high discharge current Id will be sustained. Instead, if the variable resistance element is in the high resistance state and the enabling signal EN is asserted, a negative feedback control loop is automatically created, thereby the discharge current Id is automatically limited to a desired value: an increase in the discharge current would produce an increased voltage drop across the variable resistance element 315-1-315-n, and thus a reduction in the gate-source drive voltage of the associated transistor that realizes the switch DT1-DTn, and a consequent reduction in the discharge current Id; for a sufficiently high resistance value, the discharge current is substantially reduced to zero.

In case the enabling signal EN is not asserted, the bit line discharge circuit block 305 is not enabled and no discharge current Id is allowed to flow through DT1-DTn.

Exploiting this peculiar operation mode of the bit line discharge circuits 305, it is possible to avoid the high discharge current Id that would flow when a defective bit line (the bit line BLk in the shown example) is found to be short-circuited to a word line WLh: it is in this case sufficient that the bit line discharge circuit, associated with the defective bit line, is individually controlled so as to at least substantially limit the discharge current that can flow therethrough.

During the EWS, defects in the memory device are checked, in particular the low resistance paths or even short-circuits are individuated. Consequently, during this testing phase, a proper configuration for variable resistance elements 315-1-315-n is determined. Such proper configuration, in addition to being stored in the OUM cells 315-1-315-n, is also stored in the non-volatile storage block 140 in such a way that the initialization data are not lost, for example when the memory device is exposed to high temperatures. In view of the discussion in the foregoing, if for example the high temperatures of the packaging and assembling into PCB causes the switching of the state of the variable resistance elements 315-1-315-n, a high bit-line discharge current may flow where the defects are present.

In order to avoid this problem, at the power up of the memory device, the control block 145 verifies the state of the check flag bit and, based on the detected state, the control block 145 determines if the initialization of the memory device needs to be performed. In the affirmative case, the device initialization procedure transfers the initialization data stored in the non-volatile storage block 140 into the initialization block 120, in particular, the variable-resistance elements 315-1-315-n are properly configured. Thus, the memory device is properly initialized.

Similar considerations may be made for those initialization data related to the configuration of trimmerable circuit structures, possibly present in the memory device, such as trimmerable voltage/current generators, voltage/current partitioners, and in general any circuit structure whose parameters can be trimmed after the device manufacturing. In fact, during the EWS a proper trimming configuration is determined for such circuit structures. Such proper trimming configuration is stored into the non-volatile storage block 140 in such a way that the initialization data for the trimmerable circuit structures are not lost, for example when the memory device is exposed to high temperatures, and is transferred into the initialization block 120 when the control block 145 ascertains that the initialization of memory device needs to be performed, so as to properly configure the trimmable circuit structures.

In particular, the non-volatile storage block 140 stores configuration data for the initialization memory cells of the block 120 relating to the values (determined during the EWS) of the reference currents/voltages to be generated during the memory device operation for reading the OUM cells of the matrix 105. In such a way, when the control block 145 ascertains that the memory device needs to be initialized, during the device initialization procedure the configuration data stored in the non-volatile storage block 140 are copied into prescribed initialization memory cells of the initialization block 120, which can then exploited for generating the desired voltages/currents.

So far, the case of a single detector phase-change memory cell FMC, adapted to behave as a check flag bit, has been discussed.

When the memory device is exposed to high temperatures, it may happen that the use a single detector phase-change memory cell FMC does not guarantee the correct detection of the switching of the OUM cells. For example, due to usual statistical distribution of the memory cells characteristic parameters, the single detector phase-change memory cell FMC may happen to be relatively hard to be set, and thus it may not switch even if the memory device is exposed to high temperatures; other memory cells, in the matrix 105, and in particular in the block 120, may be more easily switched than the detector phase-change memory cell FMC. In this case, the state of the check flag bit remains a "0" notwithstanding a possible switching of the OUM cells in the matrix 105, and particularly in the block 120. This may be critical, for example because some data stored in the OUM cells, e.g. the initialization data, are lost without the user is made aware of this. For example, the memory device may be not properly initialized.

In order to avoid this problem, in another embodiment of the invention, a sufficiently large population of detector phase-change memory cells FMC may be provided instead than a single one, possibly arranged in a portion of the matrix 105, or in a separate array.

In an embodiment of the invention, after the memory device has been initialized, the detector phase-change memory cells are all reset to a substantially similar, high resistance value.

After the device is exposed to a high temperature, a statistical distribution in the resistance values of the detector cells is obtained, that resembles the statistical distribution of the memory cells of the matrix 105. The larger the population of detector cells, the more it is likely that at least some of them switched to the set status upon exposure to high temperatures.

A distribution of the states of the check flag bits is thus associated with the population of the detector phase-change memory cells FMC (a certain number of check flag bits will be logic "1"s, the remaining will be logic "0"s).

At the power up of the memory device, the distribution of the resistance values of the detector cells may be used for deriving an indication that the information stored in the OUM cells may have been lost. In such a way, when the control block 145 ascertains that at least one of detector phase-change memory cells has switched to the set status, it starts the device initialization procedure, so that the memory device may be properly initialized.

In a further embodiment of the invention, the detector phase-change memory cells of the above-mentioned population may be reset to resistance values which vary from detector cell to detector cell, in such a way to obtain a statistical distribution of resistance values; in particular, one or preferably more of the detector phase-change memory cells are deliberately "lightly" reset, so that the exposure to relatively high temperatures for even a short time is sufficient to guarantee the switching of these detector phase-change memory cells from the reset status to the set status. To this purpose, each detector phase-change memory cell may be characterized by a resistance value, corresponding to the reset status, closer to the resistance value corresponding to the set status, so as to result susceptible of switching to the set status after exposure to high temperatures for even a short time. Thus, it is more likely that in a lower time of exposure to high temperatures at least one detector phase-change cell switches from reset status to set status.

At the power up of the memory device, the control block 145 ascertains if at least one of the detector phase-change memory cells is switched and, if this is the case, starts the device initialization procedure, so that the memory device may be properly initialized.

Up to now, it has been assumed that for each power up of the memory device, the control block 145 senses the detector phase-change memory cell(s), and, if the associated check flag bit(s) is a "1", it causes the initialization of the memory device to be performed.

Alternatively, in a further embodiment of the invention, the initialization of the memory device may be performed not every power up, but after a predetermined number of power-ups. Such predetermined number of power-ups is for example stored into non-volatile storage block 140. Additionally, an area of the non-volatile storage block 140 may be used to store in a non-volatile way a power-ups counter value. The control block 145 increases the counter value at each power up and when it ascertains that the state of the check flag bit is a "1", it starts the device initialization procedure. The device initialization procedure firstly compares the power-up counter value stored in the non-volatile storage block 140 with the predetermined number. If the counter value is greater than the predetermined number, the control block 145 causes the initialization of the memory device to be performed. Vice versa, the memory device does not need to be reinitialized.

Another embodiment of the present invention provides for a set of non-volatile storage elements that do not lose the information data stored therein during packaging or during assembling of the package device into PCB when the memory is exposed to high temperatures, adapted to store the status of corresponding detector phase-change memory cells after the performance of the initialization procedure. This allows detecting the switching of the OUM detector cells by comparing, for each detector phase-change memory cell, the status stored in the non-volatile storage element with the status of the detector phase-change memory cell.

Similarly to the cells of the initialization block 120, used for storing the initialization data, also the memory cells MC intended to store user's data are subjected to switch their status and loose the information stored therein, for example due to exposure to high temperatures In another embodiment of the invention, the detector phase-change memory cell(s) FMC are thus also exploited for detecting a switching of OUM cells MC, from reset status to set status, and thus a potential loss of user's information stored therein due, for example, to the exposure to high temperatures and to other disturbances.

In yet another embodiment of the invention, a refresh circuitry is provided in the memory device, adapted to manage the refresh of the information stored in the memory cells MC from time to time. In particular, the refresh circuitry exploits the detector memory cells to determine when it is necessary to perform the refresh: for example, this can be achieved by using detector phase-change memory cells which are deliberately reset to a lower resistance than the target reset resistance of the memory cells, and which are thus susceptible of switching to the set status after exposure to high temperature for a lower time: when these detector cells switches to the set status, the control block may signal to the refresh circuit, which starts the refresh procedure, so as to strengthen the data stored in the memory cell.

Moreover, an electronic system, such as a computer system, may incorporate the memory device 100 according to an embodiment of the invention.

Finally, although in the foregoing reference has always been made to OUM cell, this is not to be intended as a limitation of the present invention, which applies as well to other types of devices, such as for example ferroelectric memories.

From the foregoing it will be appreciated that, although specific embodiments of the invention have been described herein for purposes of illustration, various modifications may be made without deviating from the spirit and scope of the invention.

What is claimed is:

1. A semiconductor memory device, including a plurality of programmable memory cells each one adapted to be brought into one among at least a first status and a second status, said plurality of memory cells including memory cells intended to store data, and means for accessing the memory cells for reading/modifying their status, wherein
at least one detector memory cell in said plurality, and control means operatively associated with the at least one detector memory cell, said control means being adapted to establish a potential loss of the data stored in the memory cells of said plurality based on a detected spontaneously occurred switching of the status of the at least one detector memory cell to the first status.

2. The semiconductor memory device according to claim 1, wherein said control means are further adapted to cause a restore in at least one of the memory cells of said plurality the information potentially lost in case the detector memory cell is ascertained to be in the first status.

3. The semiconductor memory device according to claim 2, wherein said control means are further adapted to cause the at least one detector memory cell to be brought into the second status as a consequence of said restore of the information potentially lost.

4. A semiconductor memory device, including a plurality of programmable memory cells each one adapted to be brought into one among at least a first status and a second status, said plurality of memory cells including memory cells intended to store data, and means for accessing the memory cells for reading/modifying their status, wherein
at least one detector memory cell in said plurality, and control means operatively associated with the at least one detector memory cell, said control means being adapted to establish a potential loss of the data stored in the memory cells of said plurality based on a detected first status of the at least one detector memory cell,
wherein said control means are further adapted to cause a restore in at least one of the memory cells of said plurality the information potentially lost in case the detector memory cell is ascertained to be in the first status,
wherein said control means are further adapted to cause the at least one detector memory cell to be brought into the second status as a consequence of said restore of the information potentially lost, and
wherein the first and the second status respectively correspond to at least one first and at least one second values of an electric characteristic of the memory cells, said control means are adapted to cause the at least one second electric characteristic value to which the detector memory cell is brought to be less distant from the at least one first electric characteristic value compared to the other memory cells of said plurality.

5. A semiconductor memory device, including a plurality of programmable memory cells each one adapted to be brought into one among at least a first status and a second status, said plurality of memory cells including memory cells intended to store data, and means for accessing the memory cells for reading/modifying their status, wherein
at least one detector memory cell in said plurality, and control means operatively associated with the at least one detector memory cell, said control means being adapted to establish a potential loss of the data stored in the memory cells of said plurality based on a detected first status of the at least one detector memory cell,
wherein said control means are further adapted to cause a restore in at least one of the memory cells of said plurality the information potentially lost in case the detector memory cell is ascertained to be in the first status,
wherein said control means are further adapted to cause the at least one detector memory cell to be brought into the second status as a consequence of said restore of the information potentially lost, and
wherein said plurality of memory cells includes at least one initialization memory cell used for storing initialization data necessary for the correct functioning of the memory device, said initialization data being stored during a device initialization procedure.

6. The semiconductor memory device according to claim 5, further including initializing means for causing the initialization data to be stored in the at least one initialization memory cell, said initializing means including said control means, wherein said device initialization procedure is performed in case the control means detect that the detector memory cell is in the first status.

7. The semiconductor memory device according to claim 6, wherein said memory cells are susceptible of losing information data in consequence to the exposure to heat.

8. The semiconductor memory device according to claim 1, wherein said memory cells include phase-change storage elements.

9. The semiconductor memory device according to claim 1, wherein said memory cells include ferroelectric storage elements.

10. The semiconductor memory device according to claim 7, in which the initializing means includes non-volatile storage means adapted to store a back-up version of the initialization data for the memory device, said non-volatile storage means being less susceptible to lose data when exposed to heat than said memory cells.

11. The semiconductor memory device according to claim 1, wherein said memory cells intended to store data are arranged in at least one first array, and said at least one detector memory cell includes a plurality of detector memory cells arranged in at least one second array distinct from the first array.

12. The semiconductor memory device according to claim 1, further including means for refreshing the data stored in the memory cells, said means for refreshing including said control means, whereby a refresh is caused when the at least one detector memory cells is ascertained to be in the first status.

13. A semiconductor memory device, including a plurality of programmable memory cells each one adapted to be brought into one among at least a first status and a second status, said plurality of memory cells including memory cells intended to store data, and means for accessing the memory cells for reading/modifying their status, wherein
  at least one detector memory cell in said plurality, and control means operatively associated with the at least one detector memory cell, said control means being adapted to establish a potential loss of the data stored in the memory cells of said plurality based on a detected first status of the at least one detector memory cell, and
  further comprising a power-on reset signal asserted upon powering up of the memory device, said power-on reset signal causing the control means to check the status of the at least one detector memory cell at the memory device power-on.

14. In a semiconductor memory device, including a plurality of programmable memory cells each one adapted to be brought into one among at least a first status and a second status, said plurality of memory cells including memory cells intended to store data, and means for accessing the memory cells for reading/modifying their status, a method including:
  providing at least one detector memory cell in said plurality;
  providing control means operatively associated with the at least one detector memory cell, said control means being adapted to establish a potential loss of the data stored in the memory cells of said plurality based on a detected spontaneously occurred switching of the status of the at least one detector memory cell to the first status.

15. In a semiconductor memory device, including a plurality of programmable memory cells each one adapted to be brought into one among at least a first status and a second status, said plurality of memory cells including memory cells intended to store data, and means for accessing the memory cells for reading/modifying their status, a method including:
  providing at least one detector memory cell in said plurality;
  providing control means operatively associated with the at least one detector memory cell, said control means being adapted to establish a potential loss of the data stored in the memory cells of said plurality based on a detected first status of the at least one detector memory cell,
  wherein said ascertaining is performed at the memory device power up.

16. An integrated circuit, comprising:
  a first nonvolatile memory cell programmable in a state; and
  a second nonvolatile memory cell operable to indicate a potential spontaneous change in the state of the first memory cell.

17. An integrated circuit, comprising:
  a first nonvolatile memory cell programmable in a state; and
  a second nonvolatile memory cell operable to indicate a potential change in the state of the first memory cell caused by the first memory cell experiencing a stimulus having a value equal to or greater than a predetermined threshold value.

18. The integrated circuit of claim 17 wherein the stimulus comprises a temperature.

19. An integrated circuit, comprising:
  a first nonvolatile memory cell programmable in a higher-resistance state; and
  a second nonvolatile memory cell operable to indicate a potential change in the state of the first memory cell from the higher-resistance state to a lower-resistance state.

20. The integrated circuit of claim 16 wherein the second memory cell is:
  programmable in the same state as the first memory cell; and
  operable to indicate a potential change in the state of the first memory cell by changing states from the same state to a different state.

21. The integrated circuit of claim 16, further comprising:
  a third nonvolatile memory cell operable to store a data value corresponding to the state; and
  a controller operable to reprogram the first memory cell in the state using the data value stored in the third memory cell in response to the second memory cell indicating a change in the state of the first memory cell.

22. The integrated circuit of claim 16 wherein the first and second nonvolatile memory cells comprise respective ovonic unified memory cells.

23. An integrated circuit, comprising:
  first and second nonvolatile memory cells comprising respective ovonic unified memory cells;
  the first memory cell operable to be programmed in an amorphous state; and
  the second memory cell operable to indicate a change in the state of the first memory cell from the amorphous state to a crystalline state.

24. The integrated circuit of claim 16 wherein:
  the first nonvolatile memory cell is programmable in the state to a strong level; and
  the second nonvolatile memory cell is programmable in the state to a weak level and is operable to indicate a potential change in the state of the first memory cell by changing to a second state.

25. The integrated circuit of claim 24, further comprising a controller operable refresh the first memory cell in response to the second memory cell changing to the second state.

26. An integrated circuit, comprising:
  a first nonvolatile memory cell programmable in a state to a strong level; and
  a second nonvolatile memory cell programmable in the state to a weak level and operable to indicate a potential change in the state of the first memory cell by changing to a second state, wherein
  the first memory cell is operable to change from the first state to the second state in response to a stimulus after a first time, and
  the second memory cell is operable to change from the first state to the second state in response to the stimulus after a second time that is shorter than the first time.

27. An electronic system, comprising:
  an integrated circuit, comprising,
    a first nonvolatile memory cell programmable in a state, and
    a second nonvolatile memory cell operable to indicate a possible spontaneous change in the state of the first memory cell.

28. A method, comprising:
  storing a first data value in a first nonvolatile memory cell;
  storing a second data value in a second nonvolatile memory cell;
  reading the second nonvolatile memory cell after storing the first and second data values in the first and second memory cells, respectively; and
  determining that the first memory cell may store a data value other than the first data value in response to the second memory cell spontaneously storing a data value other than the second data value.

29. The method of claim 28 wherein the second data value equals the first data value.

30. The method of claim 28 wherein the first and second data values equal logic 0.

31. The method of claim 28 wherein:
storing the first data value comprises programming a first ovonic unified memory cell in an amorphous state; and
storing a second data value comprises programming a second ovonic unified memory cell in the amorphous state.

32. The method of claim 28, further comprising refreshing the first memory cell in response to the second memory cell storing a data value other than the second data value.

33. The method of claim 28, further comprising in response to the second memory cell storing a data value other than the second data value:
retrieving from a third nonvolatile memory cell a third data value that corresponds to the first data value; and
restoring the first data value in the first memory cell using the third data value.

34. The method of claim 33 wherein the third data value equals the first data value.

35. The method of claim 28, further comprising restoring the second data value in the second memory cell in response to the second memory cell storing a data value other than the second data value.

36. A method, comprising:
storing a first data value in a first nonvolatile memory cell;
storing a second data value in a second nonvolatile memory cell;
reading the second nonvolatile memory cell after storing the first and second data values in the first and second memory cells, respectively; and
determining that the first memory cell may store a data value other than the first data value in response to the second memory cell storing a data value other than the second data value,
wherein reading the second memory cell comprises reading the second memory cell in response to a power-on reset signal.

* * * * *